(12) United States Patent
Kapoor

(10) Patent No.: US 7,772,619 B2
(45) Date of Patent: Aug. 10, 2010

(54) SEMICONDUCTOR DEVICE HAVING A FIN STRUCTURE AND FABRICATION METHOD THEREOF

(75) Inventor: Ashok K. Kapoor, Palo Alto, CA (US)

(73) Assignee: SuVolta, Inc., Los Gatos, CA (US)

( * ) Notice: Subject to any disclaimer, the term of this patent is extended or adjusted under 35 U.S.C. 154(b) by 120 days.

(21) Appl. No.: 12/114,183

(22) Filed: May 2, 2008

(65) Prior Publication Data

US 2008/0272407 A1    Nov. 6, 2008

Related U.S. Application Data

(60) Provisional application No. 60/915,925, filed on May 3, 2007.

(51) Int. Cl.
*H01L 29/808* (2006.01)
(52) U.S. Cl. .............. 257/256; 257/347; 257/134; 257/E29.314
(58) Field of Classification Search ........... 257/134, 257/256, 347, E29.314
See application file for complete search history.

(56) References Cited

U.S. PATENT DOCUMENTS

| | | | | |
|---|---|---|---|---|
| 4,393,578 | A | 7/1983 | Cady et al. ............ | 29/576 B |
| 4,700,461 | A | 10/1987 | Choi et al. ............. | 437/41 |
| 5,141,880 | A | 8/1992 | Inoue et al. ........... | 437/29 |
| 2006/0273372 | A1 * | 12/2006 | Voldman et al. ....... | 257/308 |
| 2007/0040221 | A1 * | 2/2007 | Gossner et al. ........ | 257/355 |
| 2008/0173942 | A1 * | 7/2008 | Zhu et al. .............. | 257/347 |
| 2008/0308816 | A1 | 12/2008 | Miller et al. .......... | 257/76 |

FOREIGN PATENT DOCUMENTS

| | | |
|---|---|---|
| DE | 10 2005 039 365 A1 | 2/2007 |
| EP | 0 623 949 A1 | 11/1994 |
| WO | WO 2007/146979 A2 | 12/2007 |
| WO | WO 2008/021919 A1 | 2/2008 |

OTHER PUBLICATIONS

PCT Notification of Transmittal of the International Search Report and the Written Opinion of the International Searching Authority, or the Declaration with attached International Search Report in International Application No. PCT/US2008/062338, dated Jul. 17, 2008, 13 pages.

* cited by examiner

*Primary Examiner*—Victor A Mandala
(74) *Attorney, Agent, or Firm*—Baker Botts L.L.P.

(57) ABSTRACT

A semiconductor device includes a silicon on insulator (SOI) substrate, comprising an insulation layer formed on semiconductor material, and a fin structure. The fin structure is formed of semiconductor material and extends from the SOI substrate. Additionally, the fin structure includes a source region, a drain region, a channel region, and a gate region. The source region, drain region, and the channel region are doped with a first type of impurities, and the gate region is doped with a second type of impurities. The gate region abuts the channel region along at least one boundary, and the channel region is operable to conduct current between the drain region and the source region when the semiconductor device is operating in an on state.

6 Claims, 7 Drawing Sheets

SEMICONDUCTOR DEVICE HAVING A FIN STRUCTURE AND FABRICATION METHOD THEREOF

RELATED APPLICATIONS

This application claims the priority benefit of U.S. Provisional Application Ser. No. 60/915,925 filed May 3, 2007, which is herein incorporated by reference in its entirety.

TECHNICAL FIELD OF THE INVENTION

This invention relates, in general, to semiconductor devices and, more particularly, to semiconductor devices that include conducting channels formed in fin structures.

BACKGROUND OF THE INVENTION

As a result of the rapid technological growth of the past several decades, transistors and other semiconductor devices have become a fundamental building block for a wide range electronic components. Metal-oxide silicon field-effect transistors (MOSFET) have been the primary choice for transistors in many applications including general-use microprocessors, digital signal processors, application specific integrated circuits (ASICs) and various other forms of electronic devices. With the demand for electronic devices that are increasingly smaller and faster, the inclusion of the metal oxide layer from which MOSFETs derive their name creates significant limitations to further improvements in the size and operating speed of such devices.

As a result, the focus of industry development has begun to shift to junction field effect transistors (JFETs) and other types of semiconductor devices. Nonetheless, because these types of semiconductor devices have received far less attention over the past several years, development and design of these devices lags behind that of MOSFETs. Improvements must be made to the operating characteristics of JFETs for these devices to server as realistic alternatives to MOSFET devices.

SUMMARY OF THE INVENTION

In accordance with the present invention, the disadvantages and problems associated with prior semiconductor devices have been substantially reduced or eliminated.

In accordance with one embodiment of the present invention, a semiconductor device includes a silicon on insulator (SOI) substrate, comprising an insulation layer formed on semiconductor material, and a fin structure. The fin structure is formed of semiconductor material and extends from the SOI substrate. Additionally, the fin structure includes a source region, a drain region, a channel region, and a gate region. The source region, drain region, and the channel region are doped with a first type of impurities, and the gate region is doped with a second type of impurities. The gate region abuts the channel region along at least one boundary, and the channel region is operable to conduct current between the drain region and the source region when the semiconductor device is operating in an on state.

Technical advantages of certain embodiments of the present invention include providing a semiconductor device with increased operating speed and reduced power consumption. Other technical advantages of the present invention will be readily apparent to one skilled in the art from the following figures, descriptions, and claims. Additionally, while specific advantages have been enumerated above, various embodiments may include all, some, or none of the enumerated advantages. The following technical advantages may be achieved by some, none, or all of the embodiments of the present invention.

BRIEF DESCRIPTION OF THE DRAWINGS

For a more complete understanding of the present invention and its advantages, reference is now made to the following descriptions, taken in conjunction with the accompanying drawings, in which.

DETAILED DESCRIPTION OF THE INVENTION

Figure 1A:
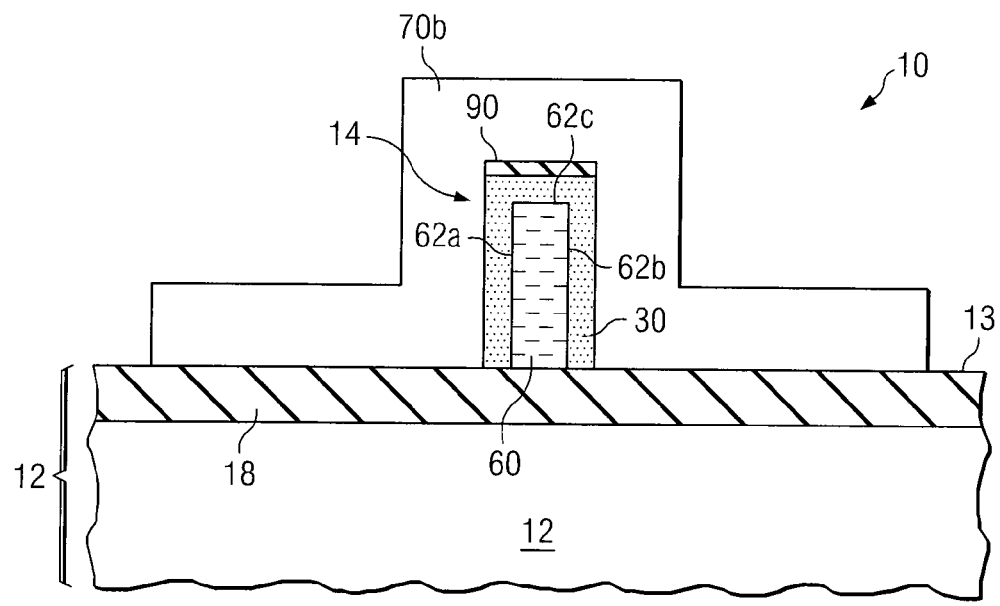
FIGS. 1A-1C illustrate various views of a semiconductor device according to a particular embodiment of the present invention.
Figure 1B:
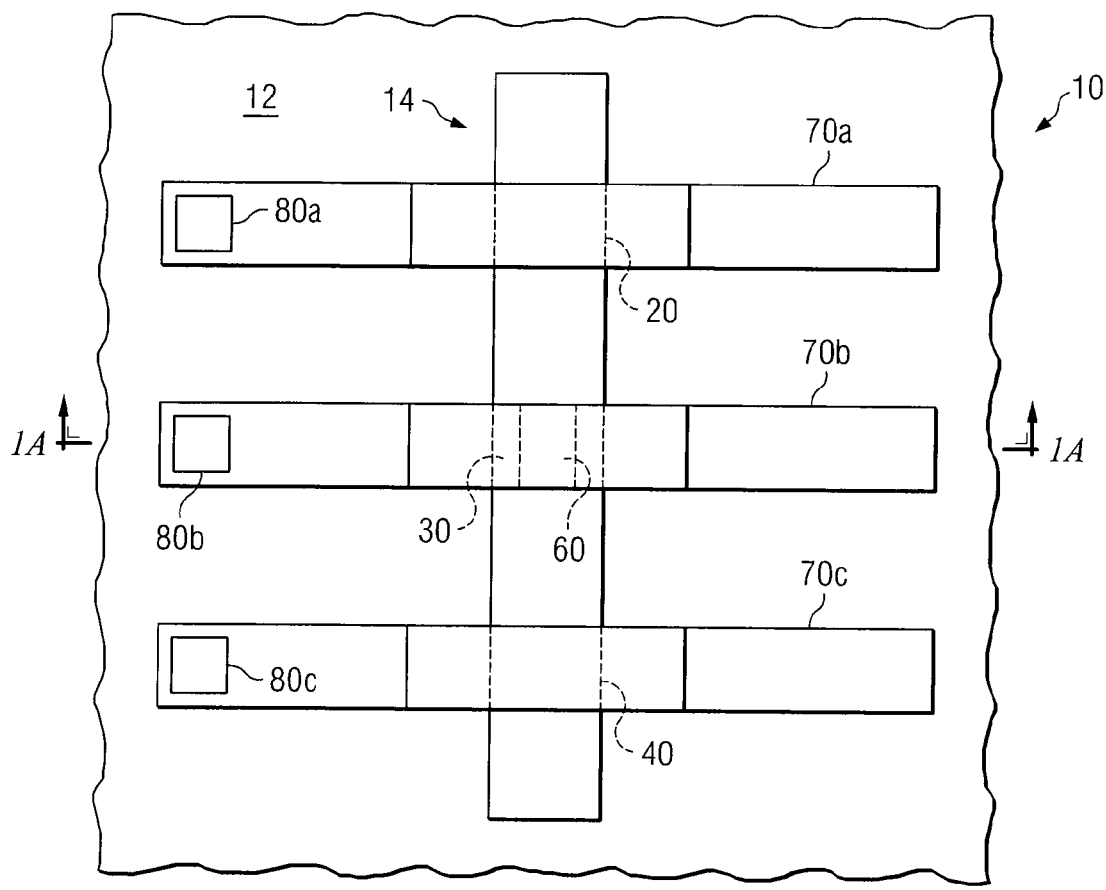
Figure 1C:
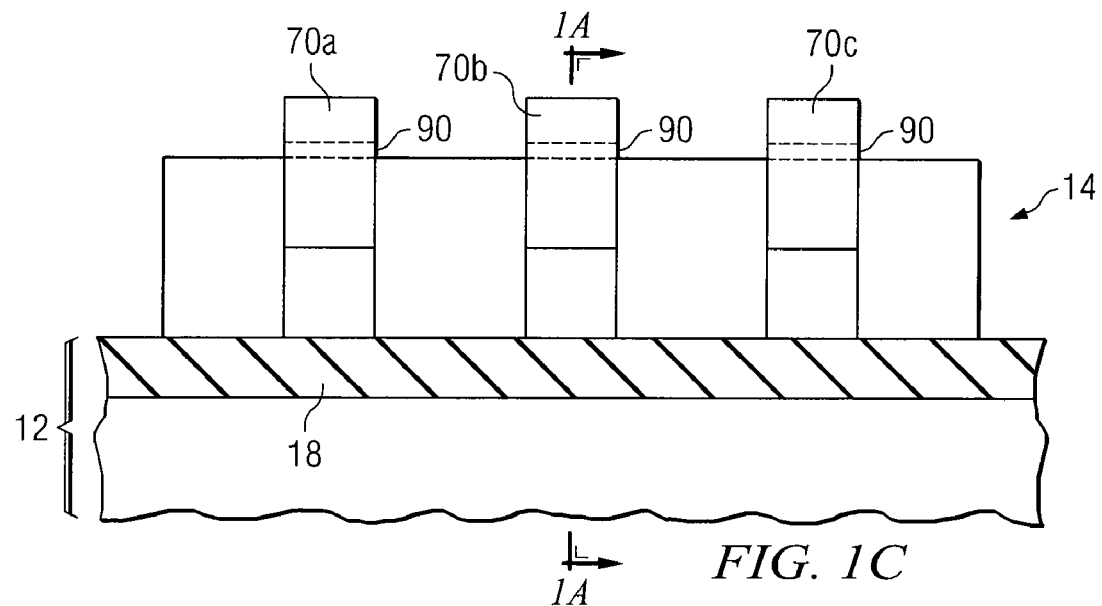

FIGS. 1A-1C show a cross-sectional, top, and side view, respectively, of a semiconductor device 10 according to a particular embodiment of the present invention. In particular, FIG. 1A represents a cross-sectional view of semiconductor device 10 when sliced along the plane illustrated by the line marked 1A in FIG. 1B and FIG. 1C. In the embodiment illustrated by FIGS. 1A-1C, semiconductor device 10 includes a fin structure 14 formed on a silicon on insulator (SOI) substrate 12 by a combination of lithographic and etch processes. In the illustrated embodiment, semiconductor device 10 comprises a junction field effect transistor (JFET) that includes a source region 20, gate region 30, drain region 40, and channel region 60. Because channel region 60 of semiconductor device 10 is formed in fin structure 14, gate region 30 abuts channel region 60 along multiple boundaries. As a result, semiconductor device 10 may, in particular embodiments, be designed to achieve desired electrical characteristics, such as low off-state leakage current. Consequently, semiconductor device 10 may operate at higher speeds and/or with reduced power consumption.

As illustrated by FIG. 1A-1C, fin structure 14 is formed on and/or as part of silicon on insulator (SOI) substrate 12. SOI substrate 12 represents a substrate of semiconductor material upon which an insulating layer 18 has been formed. Insulating layer 18 represents a layer of insulating material capable of isolating semiconductor device 10 from the semiconductor material beneath insulating layer 18. Insulating layer 18 may be formed of any appropriate material deposited or formed on SOI substrate 12. For example, in particular embodiments, insulating layer 18 may represent a layer of silicon dioxide, silicon nitride, sapphire, and/or any other appropriate insulating material formed on SOI substrate 12 using separation by implantation of oxygen (SIMOX), wafer bonding, or other appropriate techniques.

Fin structure 14 represents a structure formed of semiconductor material on a top layer of SOI substrate 12 that extends outward and/or upward from insulating layer 18. Multiple regions may be formed within fin structure 14 through the addition of dopants to the semiconductor material of fin structure 14. For example, in particular embodiments, source region 20, gate region 30, drain region 40, and/or channel region 60 may be formed within fin structure 14 and/or may represent a portion of fin structure 14.

Source region 20 and drain region 40 are doped with a first type of impurities. For example, the first type of impurities may represent particles of n-type doping material such as antimony, arsenic, phosphorous, or any other appropriate n-type dopant. Alternatively, the first type of impurity may represent particles of p-type doping material such as boron, gallium, indium, or any other suitable p-type dopant. Source region 20 and drain region 40 are doped with the same type of impurities as channel region 60. Thus, for an n-type channel semiconductor device 10, source region 20 and drain region 40 are doped with n-type impurities. For a p-type semiconductor channel device 10, source region 20 and drain region 40 are doped with p-type impurities. In particular embodiments, source region 20 and drain region 40 have a doping concentration higher than $5 \times 10^{18}$ cm$^{-3}$ at its surface.

In particular embodiments, dopants are deposited in source region 20 and drain region 40 by a combination of ion implantation directly into fin structure 14 and dopant diffusion through corresponding polysilicon regions 70a and 70c, allowing the boundaries and/or dimensions of source region 20 and drain region 40 to be precisely controlled. Thus, in the illustrated embodiment, source region 20 and drain region 40 each represent a portion of fin structure 14 doped by ion implantation of impurities and/or by the diffusion of impurities from polysilicon regions 70a and 70c, respectively, abutting the relevant regions of fin structure 14.

Gate region 30 also represents a region of fin structure 14. In particular, gate region 30 is formed from semiconductor material in fin structure 14 to which a second type of impurity is added. As a result, gate region 30 has a second conductivity type. Thus, for an n-type channel semiconductor device 10, gate region 30 is doped with p-type impurities. For a p-type channel semiconductor device 10, gate region 30 is doped with n-type impurities. In particular embodiments, gate region 30 is doped with the second type of impurity to a concentration higher than $1 \times 10^{18}$ cm$^{-3}$ at the surface. As described further below, when a voltage is applied to gate region 30, the applied voltage alters the conductivity of the channel region 60 surrounded by gate region 30, thereby facilitating or impeding the flow of current between source region 20 and drain region 40. Although FIGS. 1A-1C illustrate an embodiment of semiconductor device 10 that includes only a single gate region 30, alternative embodiments may include multiple gate regions 30. One example of such an embodiment is discussed further below with respect to FIGS. 2A-2B.

Returning to FIGS. 1A-1C, in particular embodiments, gate region 30 is formed by the diffusion of dopants through corresponding polysilicon regions 70b, allowing the boundaries and/or dimensions of gate region 30 to be precisely controlled. For example, in the illustrated embodiment, gate region 30 represents a portion of fin structure 14 doped by the diffusion of impurities from polysilicon region 70b abutting gate region 30. In alternative embodiments, dopants may be added to gate region 30 by a combination of ion implantation directly into fin structure 14 and dopant diffusion through polysilicon region 70b.

Channel region 60 comprises a portion of fin structure 14 that abuts gate region 30 and provides a path to conduct current between source region 20 and drain region 40. Channel region 60 is doped by the addition of the first type of impurities to a region of fin structure 14. In particular embodiments, channel region 60 is doped with n-type impurities to form an n-channel semiconductor device, and electrons flow from the source region 20 to the drain region 40 to create a current when an appropriate voltage is applied to semiconductor device 10. In alternative embodiments, channel region 60 is doped with p-type impurities to form a p-channel semiconductor device and, when an appropriate voltage is applied to semiconductor device 10, holes flow from source region 20 to drain region 40 to create a current.

Because channel region 60 is formed as a part of fin structure 14 extending from SOI substrate 12, gate region 30 can be formed to abut channel region 60 along multiple boundaries, faces, sides, and/or portions of channel region 60. For example, in the illustrated example, gate region 30 abuts channel region 60 along a first boundary 62a, a second boundary 62b, and a third boundary 62c of channel region 60. As a result, a signal applied to a contact 80b associated with gate region 30 will affect the conductivity of channel region 60 along all three of these boundaries 62. Additionally, while FIGS. 1A-1C illustrate a particular embodiment of semiconductor device 10 in which the conductivity of channel region 60 is controlled by only a single gate region 30 abutting multiple boundaries 62 of channel region 60, in alternative embodiments semiconductor device 10 may include multiple gate regions 30 controlling the conductivity of channel region 60, as described further below with respect to FIGS. 2A-2B.

Returning to FIGS. 1A-1C, polysilicon regions 70a-c comprise polysilicon structures that provide an ohmic connection between contacts 80a-c and source region 20, gate region 30, and drain region 40, respectively. In particular embodiments, polysilicon regions 70 may connect pins of an integrated circuit package to the various regions of semiconductor device 10. Furthermore, in particular embodiments, source region 20, drain region 40, and gate region 30 are formed by dopants that are diffused through polysilicon regions 70. As a result, in particular embodiments, polysilicon regions 70 may themselves comprise doped material, even after any appropriate diffusion of dopants into the various regions of SOI substrate 12 has occurred. Although FIGS. 1A-1C illustrates a particular embodiment of semiconductor device 10 that includes polysilicon regions 70 as shown, some or all of polysilicon regions 70 may be replaced by contacts formed directly on the various regions of fin structure 14.

Additionally, in particular embodiments, a protective layer 90 may be applied to fin structure 14 (as shown in FIGS. 1A and 1C) to prevent over-etching of fin structure 14 during the etching of polysilicon regions 70. Protective layer 90 may be composed of any appropriate material suitable to prevent etching of fin structure 14. In particular embodiments, protective layer 90 comprises a thin oxide layer. Protective layer 90 may be applied across the length of fin structure 14 or may be applied selectively along fin structure 14. For example, in particular embodiments, protective layer 90 may be applied only to the region of fin structure 14 surrounding gate region 30. Furthermore, after the etching of polysilicon is complete, the exposed portions of protective layer 90 (e.g., the portions not located under polysilicon regions 70a-c) may be removed as indicated by FIG. 1C. In alternative embodiments, protective layer 90 may be retained indefinitely.

In operation, channel region 60 provides a voltage-controlled conductivity path between source region 20 and drain region 40 through channel region 60. More specifically, a voltage differential between gate region 30 and source region 20 (referred to herein as $V_{GS}$) controls channel region 60 by increasing or decreasing a width of a depletion region (not shown) formed along the boundaries 62 between channel region 60 and gate region 30. As the depletion region expands and recedes, the portion of channel region 60 through which current can flow grows or shrinks, respectively. As a result, the conductivity of channel region 60 increases and decreases as $V_{GS}$ changes, and semiconductor device 10 may operate as a voltage-controlled current regulator.

Because channel region 60 is formed in fin structure 14, gate region 30 can be formed on or abut multiple faces, boundaries, and/or portions of channel region 60 as noted above. For example, as shown in FIG. 1A, channel region 60 may represent a region having a substantially rectangular cross-sectional shape that forms multiple boundaries 62. In such embodiments, gate region 30 may directly abut channel region 60 along multiple boundaries, including boundaries 62a, 62b, and 62c.

As a result of the fact that gate region 30 abuts channel region 60 along multiple different boundaries 62 of channel region 60, gate region 30 may more effectively suppress off-state leakage current in semiconductor device 10. Additionally, semiconductor device 10 may also provide improved current flow between source region 20 and drain region 40 when semiconductor device 10 is operating in the on state. Consequently, semiconductor device 10 may provide several operational benefits. Nonetheless, specific embodiments may provide some, none, or all of these benefits.

Figure 2A:
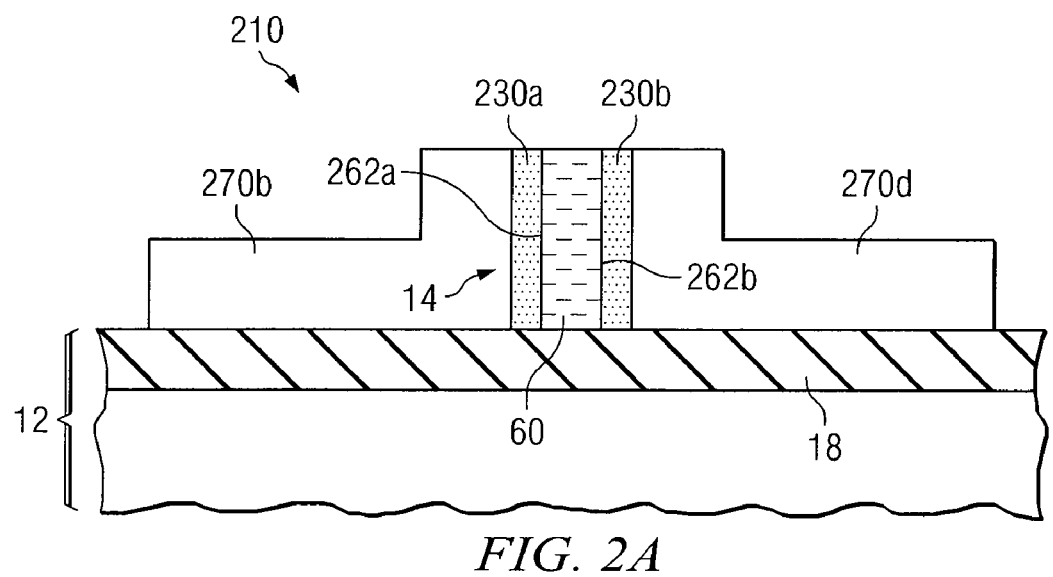
FIGS. 2A-2B illustrate various views of a semiconductor device according to an alternative embodiment of the present invention.
Figure 2B:
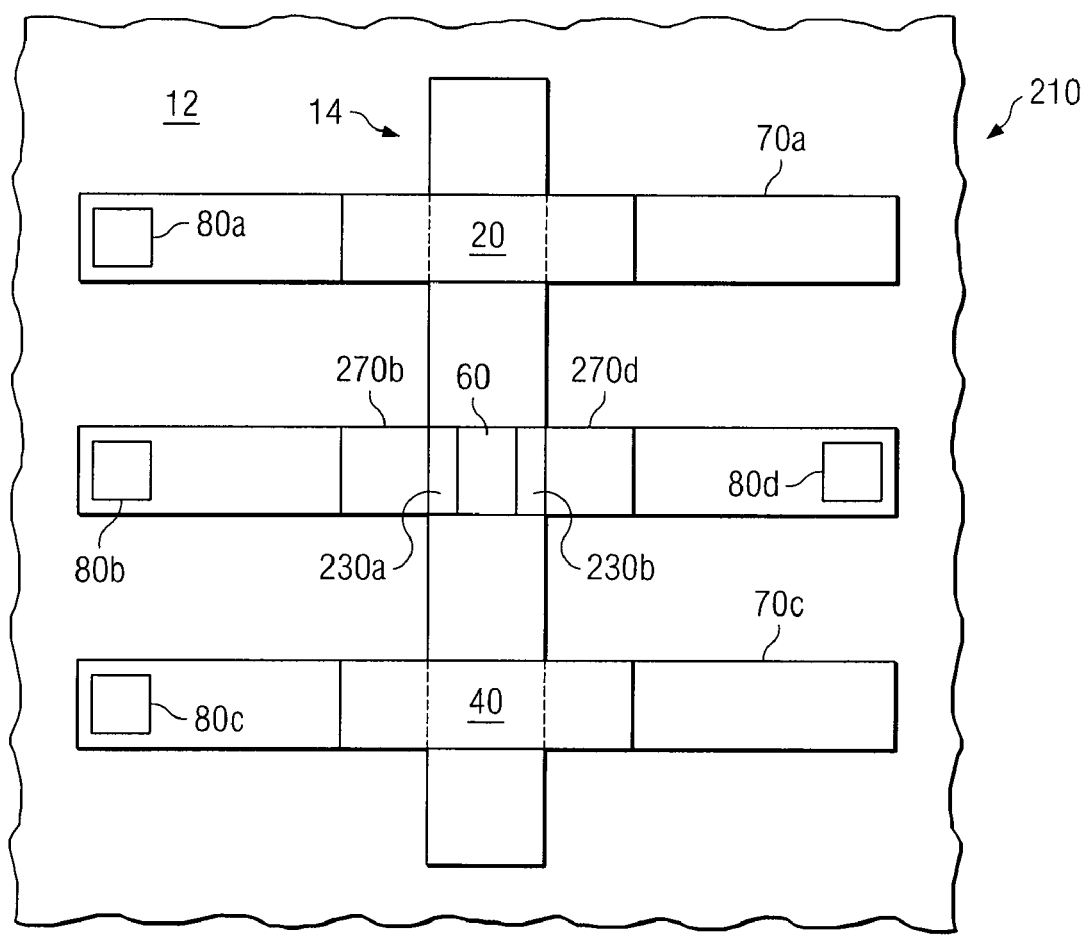

FIGS. 2A and 2B illustrate a cross-sectional and top view of a semiconductor device 210 that includes multiple different gate regions 230a-b abutting a channel region 60. In particular, FIG. 2A represents a cross-sectional view of semiconductor device 210 when sliced along the plane illustrated by line 200 in FIG. 2B. As shown in FIGS. 2A-2B, semiconductor device 210 includes SOI substrate 12, fin structure 14, insulating layer 18, source region 20, drain region 40, channel region 60, polysilicon regions 270, and contacts 80. These elements are of similar structure and function to like-numbered elements in semiconductor device 10 of FIGS. 1A-1C.

Additionally, semiconductor device 210 includes two gate regions 230a and 230b. Each is similar in structure and function to gate region 30 described above with respect to FIGS. 1A-1C. In particular, gate regions 230a-b control the conductivity of channel region 60. The voltage on each of these gate region 230 affects the size of a depletion region formed within channel region 60. As the voltage on a particular gate region 230 changes, the corresponding depletion region grows or shrinks, thereby changing the overall conductivity of channel region 60.

In particular embodiments, gate regions 230 of semiconductor device 210 may be formed by utilizing polishing processes, such as chemical-mechanical polishing (CMP), to form the two separate gate regions 230a and 230b shown in FIGS. 2A-2B. In particular, the polysilicon layer used to form a gate region of the relevant semiconductor device may be polished to remove the top portion of the gate region, thereby separating portions of the gate region shown in FIGS. 2A-2B on either side of fin structure 14 to create gate region 230a and gate region 230b, which are electrically isolated. More generally, however, gate regions 230a and 230b may be formed in any manner appropriate for the relevant embodiment of semiconductor device 210.

In operation, channel region 60 of semiconductor device 210 provides a voltage-controlled conductivity path between source region 20 and drain region 40 through channel region 60. More specifically, a voltage differential between gate region 230a and source region 20 (referred to herein as $V_{GS1}$) controls channel region 60 by increasing or decreasing a width of a first depletion region (not shown) formed along a first boundary 262a of channel region 60 (i.e., a boundary between channel region 60 and gate region 230a). Similarly, a voltage differential between gate region 230b and source region 20 (referred to herein as $V_{GS2}$) controls channel region 60 by increasing or decreasing a width of a second depletion region (not shown) formed along a second boundary 262b of channel region 60 (i.e., a boundary between channel region 60 and gate region 230b). Similar to semiconductor device 10, the depletion regions created by gate regions 230a and 230b define an area within channel region 60 through which current flow is impeded. In particular embodiments, polysilicon regions 270b and 270d may be coupled together and, as a result, receive the same input signals. Consequently, in such embodiments, gate regions 230a and 230b may create similar depletion regions that collectively reduce or increase the size of a conducting portion of channel region 60 as the voltages applied to these gate regions 230a and 230b (i.e., $V_{GS1}$ and $V_{GS2}$) change. As a result, $V_{GS1}$ is equal to $V_{GS2}$, and the conductivity of channel region 60 increases and decreases as $V_{GS1}$ and $V_{GS2}$ change. Thus, semiconductor device 210 may operate in a similar manner to semiconductor device 10 described above.

Additionally, in particular embodiments, polysilicon regions 270b and 270d may not be connected to one another and may receive different input signals. As a result, gate region 230a and 230b may each independently control the conductivity of channel region 60 based on the input signal received by their corresponding polysilicon region 270a or 270b. Consequently, in such embodiments, semiconductor device 210 may operate as a four-terminal device with two independent gates.

In such embodiments, gate regions 230a and 230b may each create depletion regions that independently reduce or increase the size of a conducting portion of channel region 60 as the voltages applied to these gate regions 230a and 230b (i.e., $V_{GS1}$ and $V_{GS2}$, respectively) change. As a result, as either of $V_{GS1}$ or $V_{GS2}$ changes, the conductivity of channel region 60 increases or decreases. Thus, semiconductor device 210 may operate as a current regulator that is controlled separately by the $V_{GS1}$ and $V_{GS2}$ voltages. Such a four-terminal device can be used to replace multiple three-terminal transistors, reducing the number of transistors needed to provide a given set of functionalities.

Figure 3:
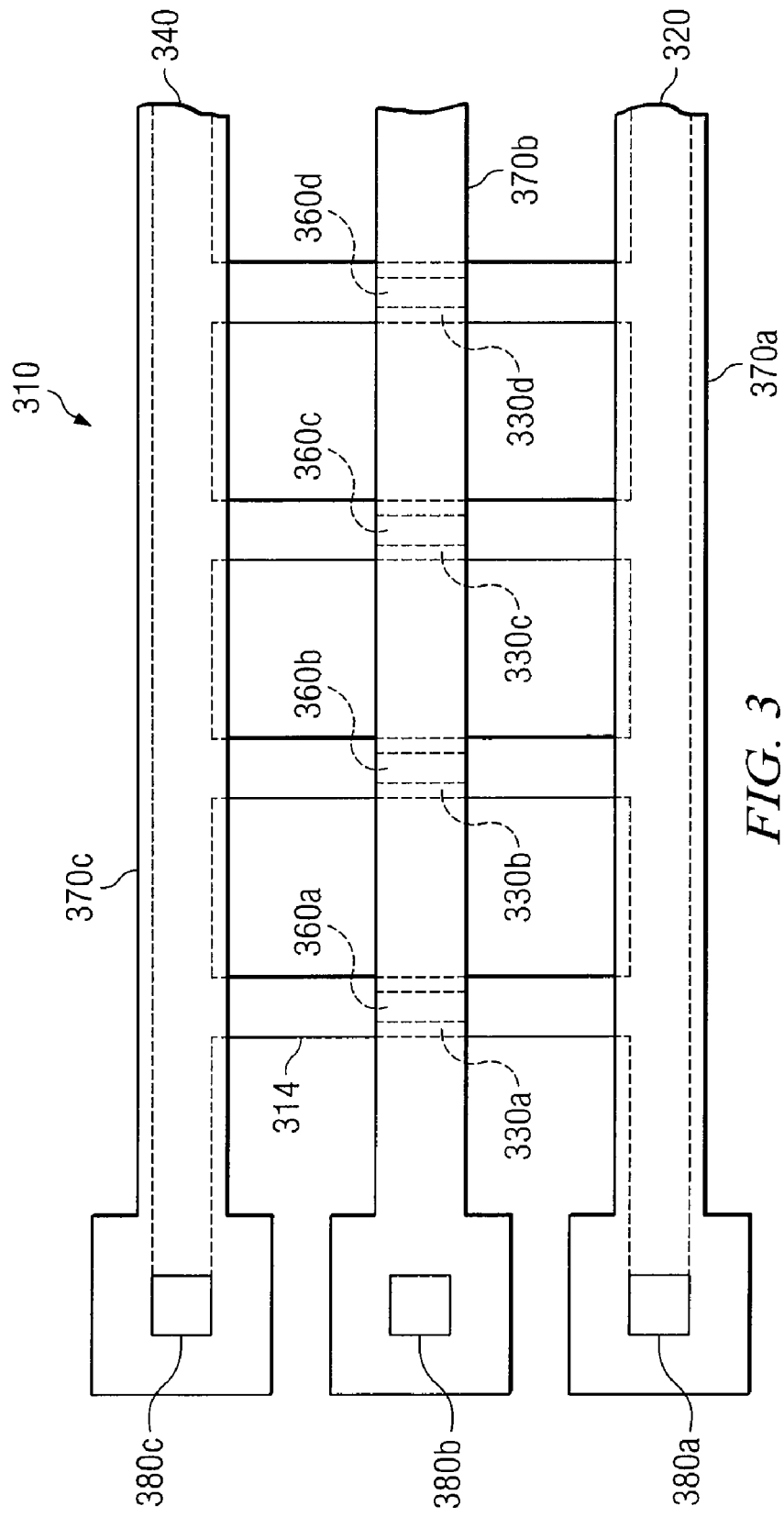
FIG. 3 illustrates a semiconductor device according to another alternative embodiment of the present invention.

FIG. 3 is a top view of semiconductor device 310 in which a fin structure 314 is formed as a lattice on an SOI substrate. Additionally, semiconductor device 310 includes polysilicon regions 370a-c formed as long, thin strips along the fin structure 314.

As with fin structure 14 in FIGS. 1A-1C, fin structure 314 is doped with dopants of a first polarity to form a source region 320 and a drain region 340. Additionally, fin structure 314 is doped with dopants of the first polarity to form multiple channel regions (shown as channel regions 360a-d). Fin structure 314 is also doped with dopants of a second polarity to form multiple gate regions (shown as gate regions 330a-d) that abut the various channel regions 360. Although the embodiment of fin structure 314 shown in FIG. 3 includes a certain number of channel regions 360a-d and gate regions 330a-d, fin structure 314 can be formed to include any appropriate number of channel regions 360 and gate regions 330.

Polysilicon region 370a forms an ohmic connection between contact 380a and source region 320, while polysilicon region 370c forms an ohmic connection between contact 380c and drain region 340. Additionally, polysilicon region 370b forms ohmic connections between contact 380b and gate regions 330a-d. As a result, a voltage differential applied between gate contact 370b and source contact 370a controls depletion regions within each of channel regions 360a-d. As a result, each of channel regions 360a-d provides a separate path for conducting current between source region 320 and drain region 340 that is controlled by a gate region 330a-d abutting the relevant channel region 360a-d along multiple boundaries.

Consequently, semiconductor device 310 forms a JFET semiconductor device having multiple channels, with each channel controlled by a gate region that abuts the channel along multiple boundaries. The inclusion of multiple channel regions 330 allows semiconductor device 310 to be designed to achieve desired electrical characteristics such as low off-state leakage current. As a result, semiconductor device 310 may, in particular embodiments, operate at higher speeds and/or with reduced power consumption over conventional semiconductor devices.

Figure 4:
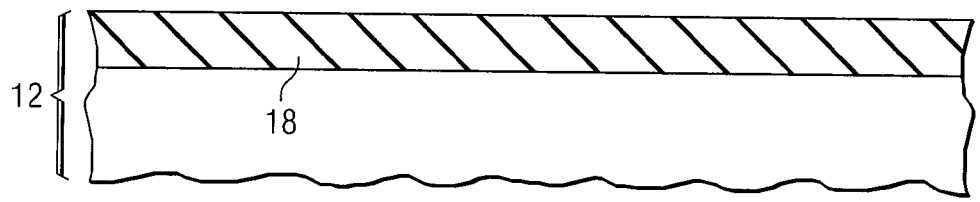
FIGS. 4-10 illustrate various steps in a method for fabricating the semiconductor device of FIG. 1.

FIGS. 4-10 illustrate steps in an example process for fabricating a particular embodiment of the semiconductor device 10 shown in FIGS. 1A-1C. In particular, FIG. 4 illustrates SOI substrate 12 after an insulating layer 18 has been formed upon a semiconductor substrate. Insulating layer 18 may represent silicon dioxide, sapphire, or any other material appropriate to isolate the semiconductor device 10 to be formed on top of insulating layer 18 from the remainder of SOI substrate 12. Insulating layer 18 may be formed using any appropriate SOI techniques. In particular embodiments, insulating layer 18 is formed through using separation by implantation of oxygen (SIMOX), wafer bonding, or other appropriate techniques.

Figure 5:
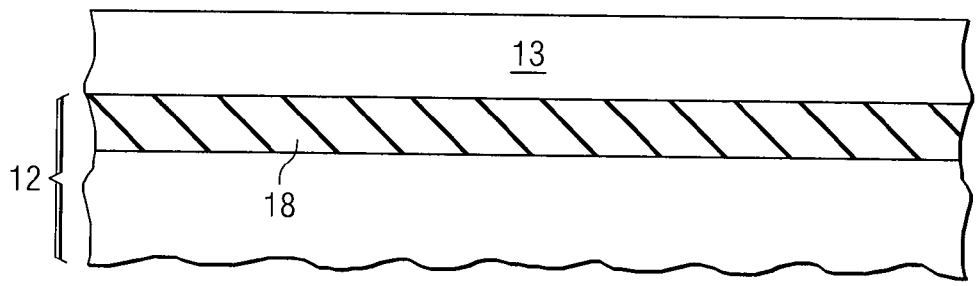

FIG. 5 illustrates SOI substrate 12 after additional semiconductor material 13 has been formed on top of insulating layer 18. As described with respect to FIGS. 6A-6B, this additional semiconductor material 13 will subsequently be used to form fin structure 14. This semiconductor material can be formed on top of insulating layer 18 using any appropriate fabrication techniques including, for example, epitaxial growth. In alternative embodiments, insulating layer 18 may be formed beneath an existing layer of semiconductor materials 13 (e.g., as a buried silicon dioxide layer formed using SIMOX techniques) and semiconductor material 13 may therefore exist prior to the creation of insulating layer 18.

Figure 6A:
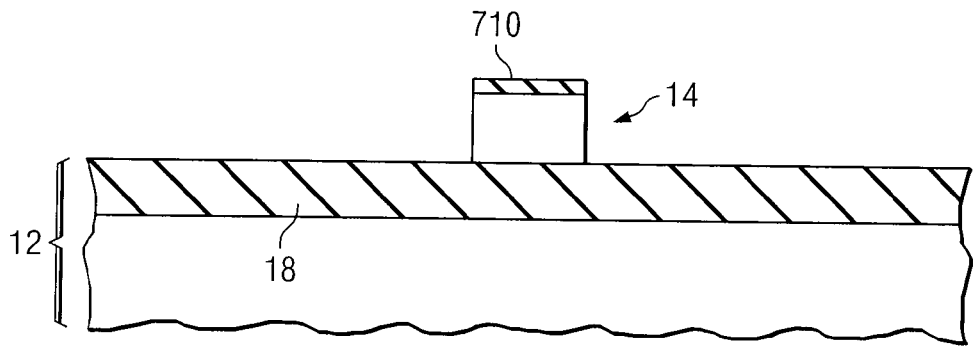
Figure 6B:
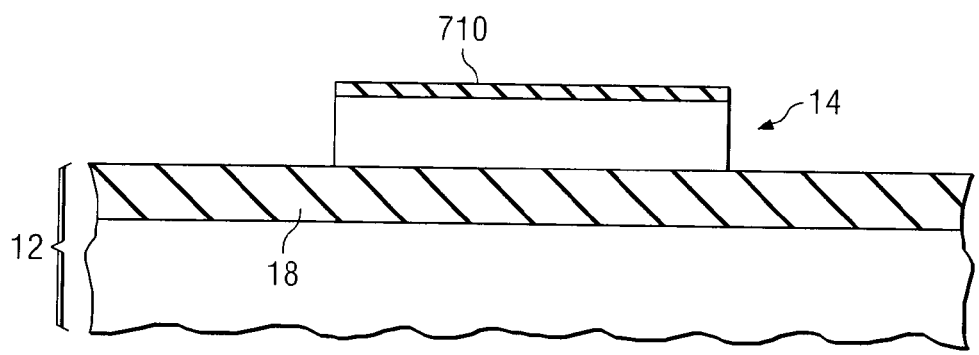

FIGS. 6A and 6B illustrate a fin patterning process that is performed, in particular embodiments, after semiconductor material 13 has been formed on top of insulating layer 18. A hard mask 710 may be applied to appropriate portions of SOI substrate 12 to delineate fin structure 14. Mask 710 may comprise silicon oxide, silicon oxide nitride, silicon nitride layer, a combination of these materials, and/or any other appropriate material for protecting portions of SOI substrate 12 from subsequent etching. After mask 710 has been applied, a layer of photoresist is applied on top of mask 710, and SOI substrate 12 may then be etched to form fin structure 14. Various processes such as optical lithography, immersion lithography, imprint lithography, direct write e-beam lithography, x-ray lithography, or extreme ultraviolet lithography may be used to define this pattern in the photoresist. Plasma etching may be used to complete the patterning process to form fin structure 14. The implant may be done at an angle. Mask 710 may then be removed or retained for subsequent steps as appropriate based on the particular techniques being utilized.

Figure 7:
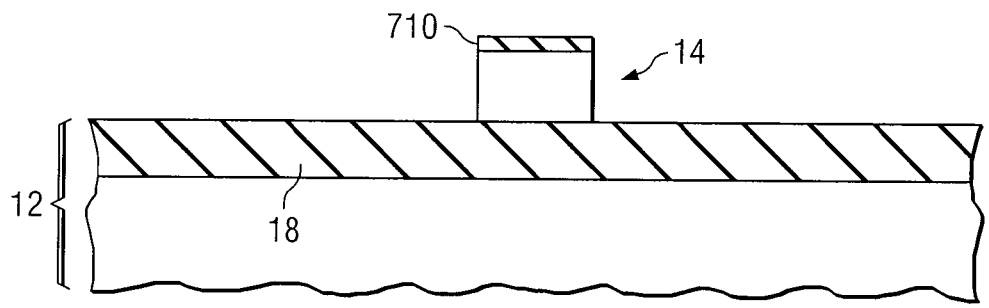

FIG. 7 illustrates the formation of channel region 60 in fin structure 14. Channel region 60 may be formed using any fabrication techniques appropriate for semiconductor device 10. In particular embodiments, channel region 60 may be formed by selective implantation using photoresist masks. For example, for an n-type semiconductor device 10, channel region 60 may be formed using an n-type dopant such as arsenic, phosphorous, or antimony with photoresist covering the regions where implants are to be blocked. In particular embodiments, this doping may be done through an angled implant of impurities into fin structure 14, as indicated by arrows 810. Photoresist may then be removed following implantation. In alternative embodiments, channel region 60 may be formed by plasma immersion doping.

Figure 8A:
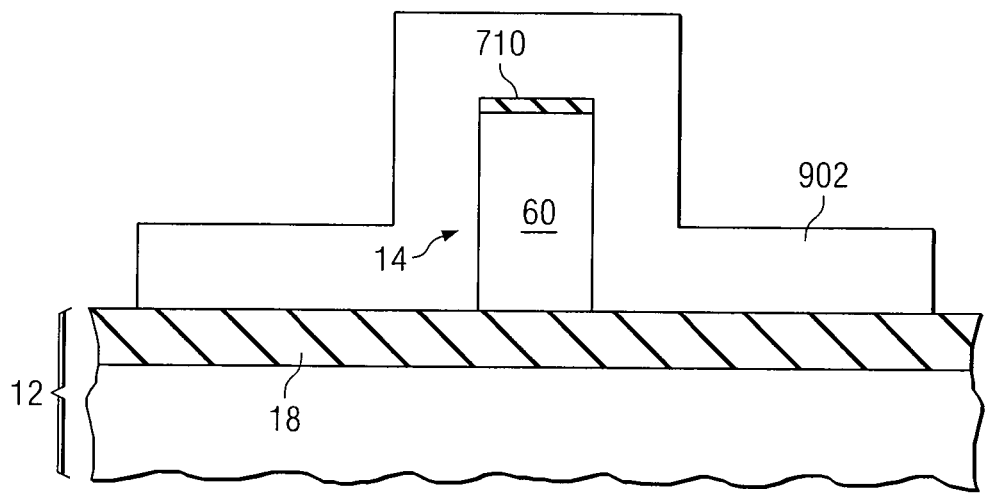
Figure 8B:
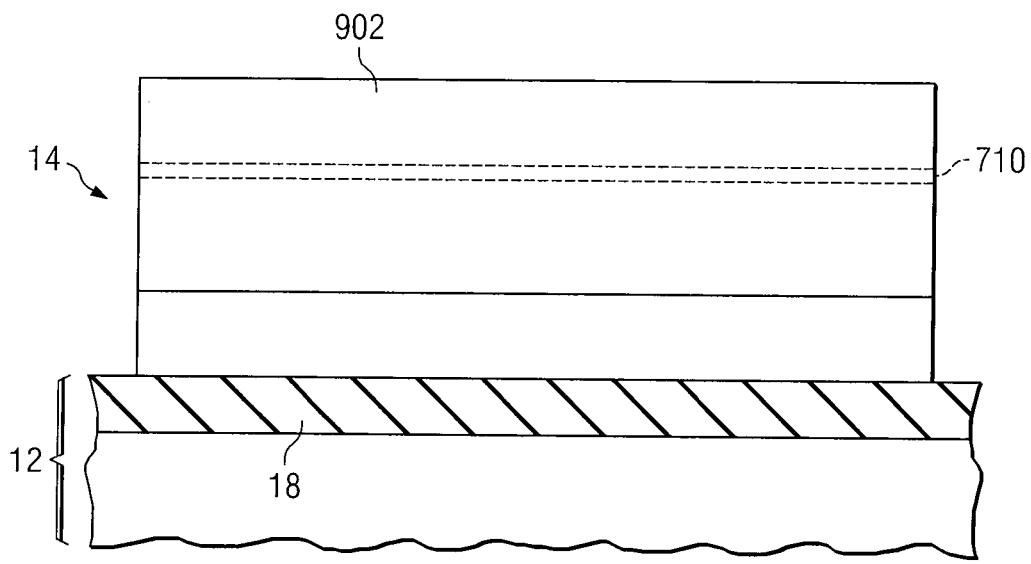

FIGS. 8A and 8B show a front, cross-sectional and a longitudinal, cross-sectional view, respectively, of semiconductor device 10 after the formation of a polysilicon layer 902 over particular portions of fin structure 14 include channel region 60. In particular embodiments, the thickness of polysilicon layer 902 varies between 100 Å and 10,000 Å.

Polysilicon regions (shown after etching in FIG. 9 as 912 and 916) may then be doped with a first type of dopants and another polysilicon region (shown after etching in FIG. 9 as 914) may then be doped with a second type of dopants using an appropriate technique. For example, in particular embodiments, polysilicon regions 912 and 916 are heavily doped with a first type of dopants (e.g., n-type) by ion implantation, plasma immersion, and/or other appropriate techniques, while polysilicon region 914 is doped with a second type of dopants (e.g., p-type) using similar or alternative suitable techniques. Polysilicon layer 902 may subsequently be etched to delineate the various polysilicon regions of semiconductor device 10.

Figure 9:
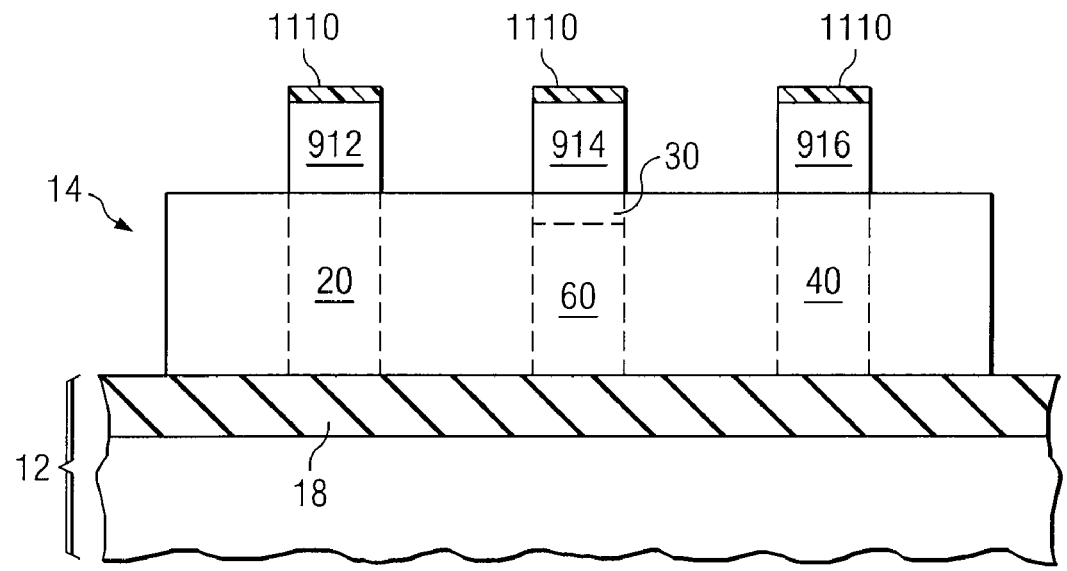
Figure 10:
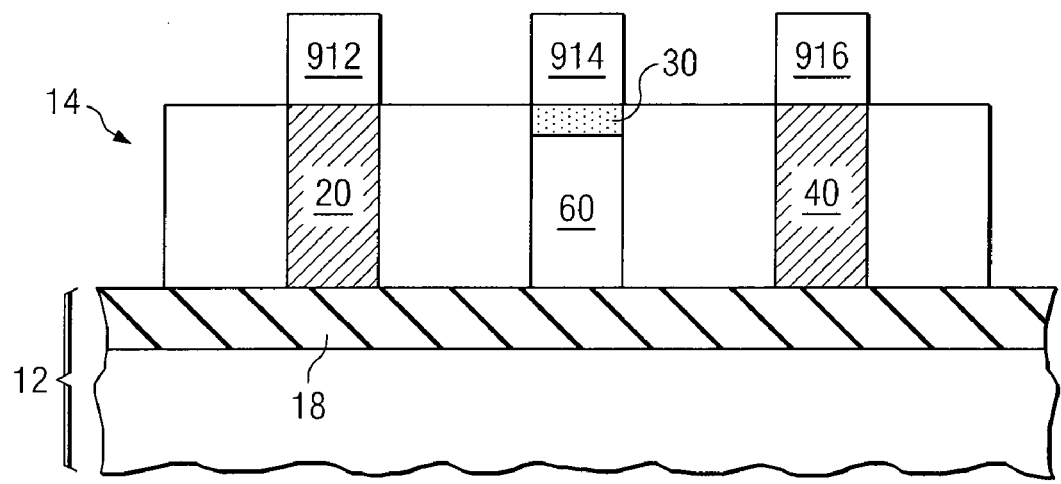

FIG. 9 illustrates a longitudinal, cross-sectional view of semiconductor device 10 after completion of a polysilicon patterning process. A layer of an anti-reflective coating may be coated on SOI substrate 12, followed by a layer of photoresist 1110. The photoresist layer 1110 is exposed and various terminals are delineated in the photoresist layer 1110. Particular embodiments may utilize various methods of patterning the photoresist, layer 1110 including optical lithography, immersion lithography, imprint lithography, direct write e-beam lithography, x-ray lithography, or extreme ultraviolet lithography. With photoresist layer 1110 as the mask, polysilicon layer 902 is then etched. This etching forms one or more grooves between various portions of polysilicon layer 902 and isolates the various terminals electrically. As a result, of this etching separate polysilicon regions 912, 914, and 916 are formed. Although not shown in FIG. 9, hard mask 710 may prevent over-etching of the portions of fin structure 14 that are not covered by polysilicon. After etching, photoresist layer 1110 is removed. Hard mask 710 may be removed or retained for subsequent steps as appropriate, depending on the particular techniques being utilized FIG. 10 is a longitudinal, cross-section view of semiconductor device 10 after doping of the various regions of fin structure 14. Specifically, FIG. 10 illustrates one example of how source region 20, gate region 30, and drain region 40 may be formed in particular embodiments. In particular embodiments, the impurities previously implanted in polysilicon regions 912, 914, and 916 may be used as a source of dopants for indirect diffusion into fin structure 14 to form source region 20, gate region 30, and drain region 40 of semiconductor device 10. In the illustrated example, source region 20 and drain region 40 contain impurities of a first type of dopant (in the illustrated example, n-type) diffused from polysilicon regions 912 and 916, respectively. Additionally, gate region 30 is formed by the diffusion of a second type of impurities (in the illustrated example, p-type) from polysilicon region 914. In alternative embodiments, multiple ion implants, varying the implant dose and energy and the implanted dopant type, may be made into polysilicon regions 912, 914, and 916 to form source region 20, gate region 30, and drain region 40. Additionally, in particular embodiments, dopants may be activated by a rapid thermal annealing process.

Subsequent fabrication steps may consist of oxidizing particular silicon regions to repair damage occurring during etching, filling polysilicon gaps with insulating material, forming contacts from silicided polysilicon regions, depositing a dielectric layer, etching contact holes in dielectric layer, forming contact holes for the source, drain, and gate terminals, laying conventional metal interconnect formation process, and/or any other steps appropriate based on the particular embodiment.

Although the present invention has been described with several embodiments, a myriad of changes, variations, alterations, transformations, and modifications may be suggested to one skilled in the art, and it is intended that the present invention encompass such changes, variations, alterations, transformations, and modifications as fall within the scope of the appended claims.

What is claimed is:

1. A semiconductor device, comprising:
   a silicon on insulator (SOI) substrate, comprising an insulation layer formed on semiconductor material;
   a fin structure formed of semiconductor material and extending from the SOI substrate, comprising:
      a source region doped with a first type of impurities;
      a drain region doped with the first type of impurities, the drain region spaced apart from the source region;
      a channel region doped with the first type of impurities and operable to conduct current between the drain region and the source region when the semiconductor device is operating in an on state; and
      a gate region doped with a second type of impurities, the gate region abutting the channel region along at least one boundary; and
   a polysilicon region formed, at least in part, on the SOI substrate, wherein the polysilicon region abuts the gate region on multiple boundaries of the gate region and forms an ohmic connection to the gate region.

2. The semiconductor device of claim 1, wherein the gate region abuts the channel region along multiple boundaries.

3. The semiconductor device of claim 1, wherein the gate region comprises a first gate region that abuts the channel region along a first boundary of the channel region and further comprising a second gate region that abuts the channel region along a second boundary of the channel region.

4. The semiconductor device of claim 1, wherein the fin structure further comprises:
   a second channel region doped with the first type of impurities and operable to conduct current between the drain region and the source region when the semiconductor device is operating in the on state,
   a second gate region doped with the second type of impurities, the second gate region abutting the second channel region along multiple boundaries.

5. The semiconductor device of claim 1, wherein the semiconductor device comprises a junction field effect transistor (JFET).

6. The semiconductor device of claim 1, wherein the semiconductor device is operable to operate in the on state when a voltage differential of approximately 0.5 volts or less is applied between the gate region and the source region of the semiconductor device.

* * * * *